United States Patent [19]
Marshall et al.

[11] Patent Number: 5,576,615
[45] Date of Patent: Nov. 19, 1996

[54] METHOD AND CIRCUIT FOR DETECTING FAULTY RECIRCULATION DIODE IN A SWITCHED MODE POWER SUPPLY

[75] Inventors: Andrew Marshall, Dallas; Stephen C. Kwan, Plano, both of Tex.

[73] Assignee: Texas Instruments Incorporated, Dallas, Tex.

[21] Appl. No.: 231,552

[22] Filed: Apr. 22, 1994

[51] Int. Cl.$^6$ ............................ G05F 1/573; H02H 3/087
[52] U.S. Cl. ........................... 323/284; 323/299; 361/93
[58] Field of Search .................................... 323/284, 285, 323/286, 287, 299; 361/18, 87, 93

[56] References Cited

U.S. PATENT DOCUMENTS

| | | | |
|---|---|---|---|
| 4,725,769 | 2/1988 | Cini et al. | 323/283 |
| 4,837,653 | 6/1989 | Yip | 361/86 |
| 4,860,154 | 8/1989 | Fazlollahi | 361/101 |

*Primary Examiner*—Peter S. Wong
*Assistant Examiner*—Derek Jardieu
*Attorney, Agent, or Firm*—W. James Brady, III; Richard L. Donaldson

[57] ABSTRACT

A circuit (10) and method for detecting a fault in a recirculation diode (13) in a switched power supply. The power supply has a switching transistor (12) that is turned on and off by a power supply control device (31), switchably applying a supply voltage (15) to an output (14). The recirculation diode (13) is connected between the output (14) and a reference potential (16). The circuit includes a sense resistor (11) in series between the supply voltage (15) and the switching transistor (12). A biasing element (25) is connected to clamp a current control element of the switching transistor (12) to the reference potential (16) when the switching transistor (12) is switched off so that a fault in the recirculation diode (13) results in a current flowing in the switching transistor (12). An amplifier (33) is connected across the sense resistor (11). The amplifier (33) has a variable gain (35) controlled by the power supply control device (31), a normal gain when the switching transistor (12) is turned on, but an increased gain when the switching transistor (12) would be normally turned off, to measure the current, if any, in the switching transistor (12) resulting from any faults in the recirculation diode (13). A control transistor (27) controlled by the power supply control device (31) is connected to switchably connect a voltage (30) to the current control element of the switching transistor (12).

18 Claims, 1 Drawing Sheet

METHOD AND CIRCUIT FOR DETECTING FAULTY RECIRCULATION DIODE IN A SWITCHED MODE POWER SUPPLY

BACKGROUND OF THE INVENTION

1. Field of the Invention

This invention relates to improvements in fault detection methods and circuits, and more particularly to improvements in methods and circuits for detecting a partially or fully faulty recirculation diode in a switched mode type power supply, and to improvements in switched mode power supply circuits.

2. Relevant Background

Although the invention herein may be applicable to power supply circuits in general, it is described particularly with reference to a switched mode power supply. A switched mode power supply is a power supply that has a switching transistor in series with a recirculation diode between a supply voltage and a reference potential, or ground. A filter may be connected between the transistor and diode to an output terminal, and frequently comprises an inductor in series between the transistor-diode junction and the output terminal, and at least one capacitor between the series path of the inductor and ground. The switching transistor is switched on and off under control, for example, of a microprocessor, microcontroller, driver IC, timer, or other such control device.

The switching transistor may be a MOSFET or other suitable switching device, and generally, in the case of an FET device, a resistor is connected between the source and gate to provide a reference voltage to the switching device. A second, control transistor may be connected to control the gate of the switching transistor. Such control transistor also may be a MOSFET device, and may be connected to switchably apply a supply voltage directly to the gate of the switching transistor in response to control signals from the microprocessor, or other control device.

In operation, the supply voltage is switchably developed across the recirculation diode by the switching transistor and applied to the output filter. When the switching transistor is on, the circuit is considered to be in an on-state, with the voltage across the recirculation diode being directly applied to the output filter. On the other hand, when the switching transistor is not conducting, the circuit is considered to be in an off-state. In the off-state, the currents that are set up in the inductance of the output filter are maintained by the recirculation diode, which allows current to be drawn from the reference potential, or ground, to the inductance.

In many applications, such as in automotive environments or the like, the supply voltages at the input to the circuit may have considerable voltage swings. Likewise, the loads attached to the output terminal of the circuits may draw excessive currents. If these voltage swings or excessive currents are not monitored, it may be possible for high currents to exist that may damage or destroy the components of the circuit, such as the switching transistor, the recirculation diode, or the components of the output filter. To protect against such high currents, switched mode power supply circuits are often provided with over-current detection circuits. Thus, if an over-current state arises in the circuit when it is in an on-state, for example, caused by an over current in the recirculation diode or at the output, protection circuitry is activated to protect the switching transistor from being damaged or destroyed.

Typical protection circuitry that may be used in switched-mode power supplies has a resistor in series with the switching transistor, and an amplifier connected to detect the voltage developed across the resistor. In an over-current conduction in the on-state of the power supply circuit, the amplifier detects a particular threshold voltage existing across the resistor, and produces an output warning. The amplifier is normally disabled during the off-state (or recirculation state) of the circuit. The switching transistor also is normally in an off state, with its gate voltage clamped to its source voltage.

If the recirculation diode partially fails, an abnormal recirculation occurs. In such condition, the diode can be thought of as a resistance in series with an ideal diode. The abnormal recirculation voltage is seen as an increased voltage across the resistance, resulting in increased power dissipation. This increased dissipation reduces efficiency, but would not be detected by the over-current detection circuit as a fault. What is needed, therefore, is a circuit that can effectively detect conditions in which the recirculation diode has partially or fully failed.

SUMMARY OF THE INVENTION

In light of the above, it is an object of the invention to provide an improved method and circuit for detecting a partial or full failure of a recirculation diode in a switched mode power supply.

It is another object of the invention to use existing circuit elements in a switched mode power supply overcurrent detection circuitry, with only minor modification, to detect a partially or fully failed recirculation diode, whereby additional detection elements are unnecessary.

It is yet another object of the invention to provide an improved method for detecting the partial or full failure of a recirculation diode in a switched mode power supply.

It is still another object of the invention to provide an improved switched mode power supply circuit.

Often switched mode power supply circuits are designed such that if an over-current situation arises in the on-state, caused by an over current in the recirculation diode or at the output, for example, protection circuitry is implemented to save the switching FET from destruction. The same circuitry used for detecting this over-current may be modified to detect faulty operation of the recirculation diode.

Thus, according to a broad aspect of the invention, a circuit is presented for detecting a fault in a recirculation diode in a switched power supply of the type in which a switching transistor, which may be a MOSFET or the like, is connected to be turned on and off in response to a power supply control device to switchably apply a supply voltage to the output of the power supply. An output filter that includes an inductor may be connected between the power supply output and the circuit output. The recirculation diode is connected between the output and a reference potential, or ground. The detection circuit includes a sense resistor in series between the supply voltage and the switching transistor. A biasing element is connected to clamp a current control element of the switching transistor to the reference potential when the switching transistor is switched off so that a fault in the recirculation diode results in a current flowing in the switching transistor when the switching transistor would normally be turned off. An amplifier is connected across the sense resistor, the amplifier having a variable gain connected to be controlled in response to the power supply control device to increase the gain of the amplifier when the switching transistor is turned off. An output of the amplifier therefore indicates that a fault exists in the recirculation diode when the switching transistor would normally be turned off. In one embodiment, a control transistor is connected to switchably connect a voltage to the current control element of the switching transistor, the control transistor being controlled by the power supply control device. The amplifier has a normal gain when the switching transistor is turned on, but when the switching transistor would be normally turned off, the amplifier gain is increased to measure the current in the switching transistor resulting from a recirculation diode fault.

According to another broad aspect of the invention, a switched power supply is presented that may be connected between a supply voltage and a reference potential to be switchably turned on and off by a power supply control device. The switched power supply has a sense resistor connected at a first terminal to the supply voltage and a recirculation diode connected at a first terminal to the reference potential. A switching transistor, which may be a MOSFET device, is connected in series between a second terminal of the sense resistor and a second terminal of the recirculation diode. The switching transistor is connected to be turned on and off in response to the power supply control device. An output filter may be connected between the second end of the recirculation diode and an output node. A biasing element, such as a resistor or the like, is connected between a control element of the switching transistor and the reference potential, and an amplifier is connected across the sense resistor. The amplifier has a variable gain connected to be controlled in response to the power supply control device to be increased when the switching transistor is turned off. Thus, an output of the amplifier indicates a fault in the recirculation diode when the switching transistor would normally be turned off. A control transistor is connected to switchably connect a voltage to the control element of the switching transistor, the control transistor being controlled by the power supply control device.

According to yet another broad aspect of the invention, a method is presented for detecting a fault in a recirculation diode in a switched power supply of the type in which a switching transistor is switched on and off to switchably apply a supply voltage to an output filter, and the recirculation diode is connected between the output filter and a reference potential. The method includes the steps of biasing a current control element of the switching transistor to the reference potential when the switching transistor is switched off. If the recirculation diode is faulty, a voltage is developed across the recirculation diode that produces a fault-indicating current to flow in the switching transistor. Then, the fault-indicating current in the switching transistor is sensed. The additional step of amplifying a voltage across a sense resistor at a first gain when the switching transistor is switched on to detect an overcurrent in the switching transistor, and amplifying a voltage across the sense resistor at a second gain when the switching transistor is switched off for sensing the fault-indicating current may be included.

BRIEF DESCRIPTION OF THE DRAWING

The invention is illustrated in the accompanying drawings, in which.

DETAILED DESCRIPTION OF THE PREFERRED EMBODIMENTS

Figure 1:
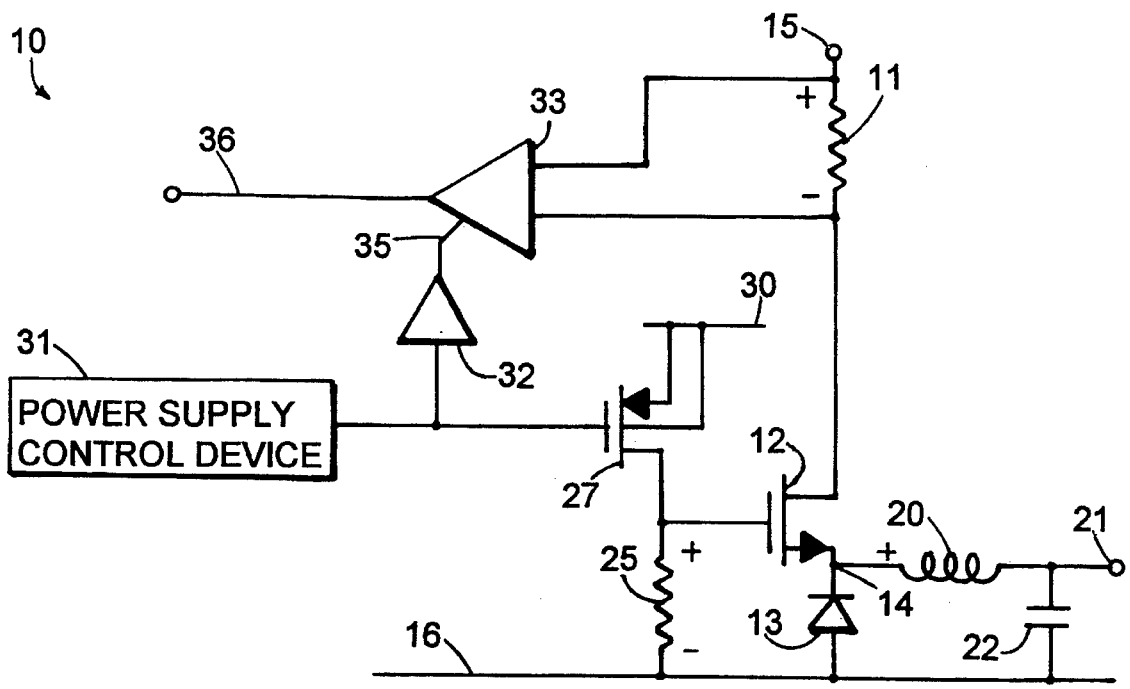
FIG. 1 is an electrical schematic diagram of a switched mode power supply circuit incorporating the recirculation diode detection method and apparatus in accordance with a preferred embodiment of the invention.

An electrical schematic diagram of a preferred embodiment of the switched mode power supply circuit 10 incorporating the recirculation diode detection method and apparatus of the invention is shown in FIG. 1. As is conventional, the circuit 10 includes a sense resistor 11, an n-channel MOSFET (NMOS) device 12, and a recirculation diode 13 connected in series between a supply voltage terminal 15 and a reference potential, or ground, rail 16. The diode 13 may be a Schottky diode. An output filter has an inductor 20 connected in series between the output node 14 of the circuit at the cathode of the recirculation diode 13 and the output terminal 21, and a capacitor 22 connected between the output terminal 21 and the reference potential rail 16.

Figure 2A:
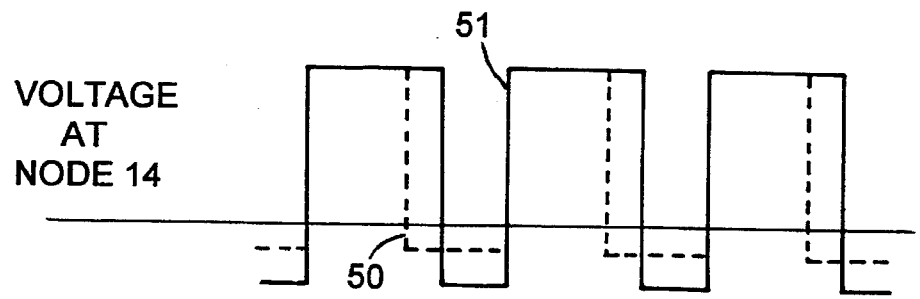
FIG. 2a is a graph showing the waveforms of the voltage appearing across the recirculation diode in the circuit of FIG. 1, produced by normal and faulty recirculation diodes.
Figure 2B:
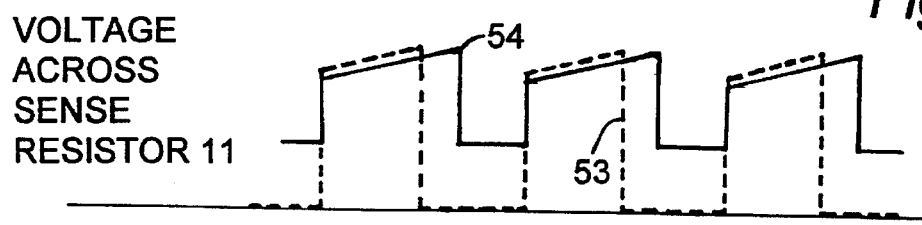
FIG. 2b is a graph showing the waveforms of the voltage appearing across the sense resistor in the circuit of FIG. 1, produced by normal and faulty recirculation diodes.
Figure 2C:
FIG. 2c is a graph of the waveform of the current in the inductor of the output filter in the circuit of FIG. 1, produced by normal and faulty recirculation diodes.

The voltage waveform generated at the output node 14 of the circuit 10 for a normal recirculation diode 13 in a switched power supply is shown by the dotted line 50 in FIG. 2a. The waveform seen at node 14 when the diode has partially failed, or is leaky, adding additional resistance that drops an additional amount of voltage is shown by the solid line 51. Likewise, the voltage appearing across the sense resistor 11 for a normal and partially failed recirculation diode 13 are shown by the dotted line 53 and solid line 54, respectively, in FIG. 2b. Finally, the output currents that flow in the inductor 20 of the output filter for a normal and partially failed recirculation diode 13 are shown by the dotted line 55 and solid line 56, respectively.

According to the invention, with reference again to FIG. 1, a biasing element such as the biasing resistor 25 illustrated is connected between the gate of the switching transistor 12 and the reference potential rail 16. When the switching transistor 12 is turned off, the biasing resistor clamps the gate of the switching transistor to the potential of the reference potential on the rail 16, such as ground. This is in contrast to prior art power supply circuits, in which a biasing resistor that corresponds generally to the biasing resistor 25 was typically connected between the gate and source of the switching transistor. The effect of the connection of the biasing resistor 25 to the reference potential rail 16 is that the gate of the switching transistor 12 includes a reference to the voltage dropped across the recirculation diode, as well as across the source and gate of the switching transistor 12. Therefore, if the recirculation diode 13 is faulty and has an additional resistance associated with it, there will be a voltage dropped across the additional diode resistance that will cause the switching transistor 12, which normally would be turned off, to conduct. This conduction will cause a measurable voltage to be developed across the sense resistor 11.

A p-channel MOSFET (PMOS) device 27, which serves as a control transistor, is connected between a supply voltage rail 30 and the gate of the switching transistor 12. The gate of the control transistor 27 is connected to be controlled by a power supply control device 31, which may be a microprocessor, microcontroller, driver IC, timer, or other such control device. Although the supply voltage rail 30 may be at the same potential as the supply voltage 15, typically a charge pump (not shown) may be used to provide a boosted voltage for rapid control of the switching transistor 12.

An amplifier 33 has its inputs connected across the sensing resistor 11 to produce an output on line 36. The amplifier 33 serves in normal operation to detect an overcurrent condition when the switching transistor 12 is turned on, for example, if the voltage developed across the resistor 11 exceeds a predetermined voltage. The amplifier 33, however, also has a variable gain control switch, controlled by signals from the power supply control device 31 on line 35. The gain control switch increases the gain of the amplifier 33 when the switching transistor 12 is turned off. As shown, the signal applied to the gate of the control transistor 27 may be applied by a buffer amplifier 32 to the gain control line 35.

One of the primary aims of the invention is to detect the partial or full failure of the recirculation diode 13, as described above. According to the invention, rather than being inactive during the turn-off mode in the operation of the switched mode power supply, the amplifier 33 and resistor 11 remain active during the recirculation phase, and the gain or sensitivity of the amplifier 33 is increased. As mentioned, the gate voltage of the switching MOS transistor 12 during recirculation is clamped at zero volts due to the placement of the resistor 25. Thus, if the recirculation diode 13 has a full or partial failure, in the recirculation phase, or turn-off mode, the source of the switching transistor 12 is pulled sufficiently below ground that the switching transistor 12 turns on and begins to pass current. This is detected by the amplifier 33, and appropriate action can be taken by the driver IC or the microprocessor controller. The gain of the amplifier is increased when the switching transistor is switched off since the maximum current that flows through the switching transistor during the recirculation phase is the current that flows in the inductor at the time of switching. Nevertheless, the current detect level during this phase may be chosen in accordance with the particular application needs, as a current above even a few milliamps can be used to signify a recirculation diode failure.

It should be noted that although the invention has been described with specific reference to transistor of specific types and conductivities, and in particular to MOSFET devices of p-channel and n-channel conductivities, other transistor types and conductivities can be used in other particular applications with appropriate voltage and polarity modifications.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A circuit for detecting a fault in a recirculation diode in a switched power supply in which a switching transistor is connected to be turned on and off in response to a power supply control device to switchably apply a supply voltage to an output, and the recirculation diode is connected between the output and a reference potential, comprising:

a sense resistor in series between the supply voltage and the switching transistor;

a biasing element connected to clamp a current control electrode of said switching transistor to the reference potential when the switching transistor is switched off, a fault in the recirculation diode causing a current to flow in the switching transistor when the switching transistor would normally be turned off; and an amplifier connected across the sensing resistor, said amplifier having a variable gain connected to be controlled in response to the power supply control device to increase the gain of said amplifier when said switching transistor is turned off, said amplifier providing an output when the switching transistor would normally be turned off to indicate that a fault exists in said recirculation diode.

2. The circuit for detecting a fault in a recirculation diode of claim 1 further comprising a control transistor connected to switchably connect a voltage to the current control electrode of said switching transistor, said control transistor being controlled by the power supply control device.

3. The circuit for detecting a fault in a recirculation diode of claim 2 wherein said switching transistor and said control transistor are MOSFET devices.

4. The circuit for detecting a fault in a recirculation diode of claim 2 wherein said switching transistor and said control transistor are of opposite conductivity types.

5. The circuit for detecting a fault in a recirculation diode of claim 2 wherein said switching transistor is an NMOS device and said control transistor is a PMOS device.

6. The circuit for detecting a fault in a recirculation diode of claim 1 wherein said biasing element is a biasing resistor.

7. A switched power supply for connection between a supply voltage and a reference potential to be switchably turned on and off by a power supply control device, comprising:

a sensing resistor connected at a first terminal to said supply voltage;

a recirculation diode connected at a first terminal to said reference potential;

a switching transistor connected in series between a second terminal of said sensing resistor and a second terminal of said recirculation diode, connected to be turned on and off in response to the power supply control device;

an output filter connected between the second terminal of said recirculation diode and an output node;

a biasing element connected between a control electrode of said switching transistor and said reference potential; and an amplifier connected across the sensing resistor, said amplifier having a variable gain connected to be controlled in response to the power supply control device to increase the gain of said amplifier when said switching transistor is turned off, said amplifier providing an output in response to a voltage across the sensing resistor due to current flow in said switching transistor when the switching transistor would normally be turned off to indicate a fault in said recirculation diode.

8. The switched power supply of claim 7 further comprising a control transistor connected to switchably connect a voltage to the control electrode of said switching transistor, said control transistor being controlled by the power supply control device.

9. The switched power supply of claim 7 wherein said recirculation diode is a Schottky diode.

10. The switched power supply of claim 9 wherein said switching transistor and said control transistor are MOSFET devices.

11. The switched power supply of claim 8 wherein said switching transistor is an NMOS device and said control transistor is a PMOS device.

12. The switched power supply of claim 9 wherein said biasing element is a resistor.

13. A method for detecting a fault in a recirculation diode in a switched power supply of the type in which a switching transistor is switched on and off to switchably apply a supply voltage to an output filter, and the recirculation diode is connected between the output filter and a reference potential, comprising:

biasing a current control electrode of the switching transistor to the reference potential when the switching transistor is switched off;

developing a voltage across the recirculation diode to cause a fault-indicating current to flow in the switching transistor when the recirculation diode is faulty; and sensing the fault-indicating current in the switching transistor.

14. The method of claim 13 further comprising amplifying a voltage across a sense resistor at a first gain when the switching transistor is switched on to detect an overcurrent in the switching transistor, and amplifying a voltage across the sense resistor at a second gain when the switching transistor is switched off for sensing the fault-indicating current.

15. The method of claim 13 wherein said step of biasing a current control electrode of the switching transistor to the reference potential when the switching transistor is switched off comprises connecting a resistor between the current control electrode and the reference potential.

16. The method of claim 13 further comprising switching the switching transistor with a control transistor connected to apply a predetermined voltage to the current control electrode of the switching transistor in response to a power supply control device.

17. The method of claim 16 further comprising providing said switching transistor and said control transistor of opposite conductivity types.

18. The method of claim 16 further comprising providing an NMOS transistor for said switching transistor and a PMOS transistor for said control transistor.

* * * * *